United States Patent
Zhao et al.

(10) Patent No.: US 11,605,536 B2
(45) Date of Patent: Mar. 14, 2023

(54) CYCLIC LOW TEMPERATURE FILM GROWTH PROCESSES

(71) Applicant: Tokyo Electron Limited, Tokyo (JP)

(72) Inventors: Jianping Zhao, Austin, TX (US); Peter Ventzek, Austin, TX (US); Toshihiko Iwao, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 113 days.

(21) Appl. No.: 17/026,168

(22) Filed: Sep. 19, 2020

(65) Prior Publication Data

US 2022/0093395 A1 Mar. 24, 2022

(51) Int. Cl.
*H01L 21/02* (2006.01)
*C23C 16/34* (2006.01)

(52) U.S. Cl.
CPC ...... *H01L 21/02247* (2013.01); *C23C 16/345* (2013.01); *H01L 21/0217* (2013.01); *H01L 21/0234* (2013.01)

(58) Field of Classification Search
None
See application file for complete search history.

(56) References Cited

U.S. PATENT DOCUMENTS

| | | | |
|---|---|---|---|
| 4,715,937 A | 12/1987 | Moslehi et al. | |
| 6,682,973 B1 * | 1/2004 | Paton | H01L 21/28202 257/295 |
| 7,651,953 B2 | 1/2010 | Todd et al. | |
| 7,972,663 B2 | 7/2011 | Wang et al. | |
| 8,076,251 B2 | 12/2011 | Akae et al. | |
| 8,129,290 B2 | 3/2012 | Balseanu et al. | |
| 8,387,557 B2 | 3/2013 | Singh et al. | |
| 2009/0155606 A1 | 6/2009 | Yoon et al. | |
| 2012/0122302 A1 | 5/2012 | Weidman et al. | |
| 2014/0073145 A1 | 3/2014 | Moffatt et al. | |
| 2014/0209026 A1 | 7/2014 | LaVoie et al. | |

FOREIGN PATENT DOCUMENTS

| | | |
|---|---|---|
| CN | 102522430 B | 10/2014 |
| JP | 5005170 B2 | 8/2012 |
| JP | 2016157940 A | 9/2016 |
| KR | 20060135186 A | 12/2006 |
| KR | 100950623 B1 | 4/2010 |
| KR | 101081632 B1 | 11/2011 |

OTHER PUBLICATIONS

Balland, B., et al., "High-temperature thermal nitridation and low-temperature electron-beam-enhanced nitridation of SiO2 thin films," Physical Status Solidi (a), Mar. 16, 1987, 2 pages.
Watanabe, Takeshi, et al, "Atomic-Order Thermal Nitridation of Silicon at Low Temperatures," IOP Science, Journal of the Electrochemical Society, vol. 1456, No. 12, Dec. 1, 1998, 1 page.
PCT International Search Report and the Written Opinion, PCT Application No. PCT/US2021/050516, dated Jan. 6, 2022, 10 pages.

* cited by examiner

Primary Examiner — Asok K Sarkar
(74) Attorney, Agent, or Firm — Slater Matsil, LLP

(57) ABSTRACT

A method of nitridation includes cyclically performing the following steps in situ within a processing chamber at a temperature less than about 400° C.: treating an unreactive surface of a substrate in the processing chamber to convert the unreactive surface to a reactive surface by exposing the unreactive surface to an energy flux, and nitridating the reactive surface using a nitrogen-based gas to convert the reactive surface to a nitride layer including a subsequent unreactive surface.

20 Claims, 5 Drawing Sheets

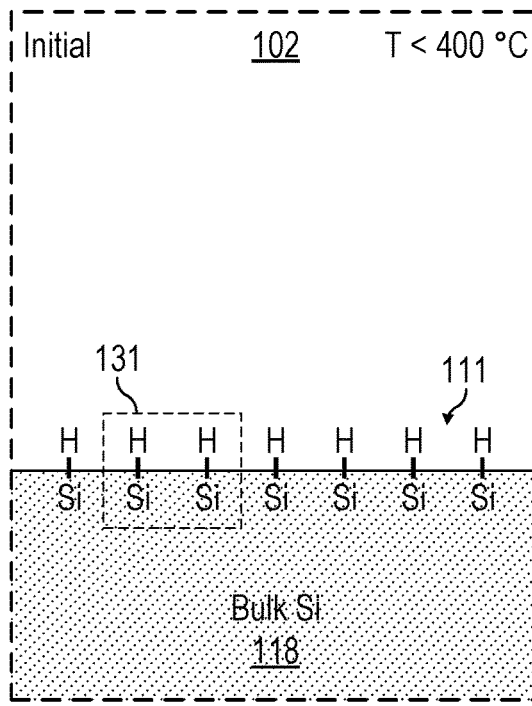
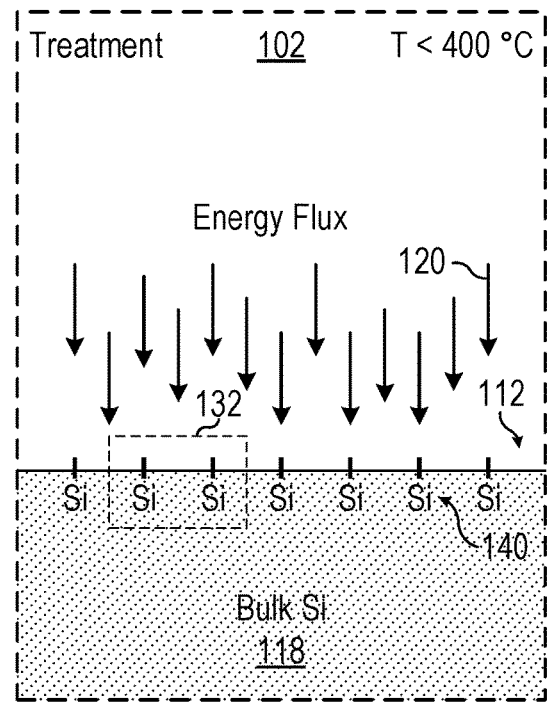
FIG. 1A
FIG. 1B
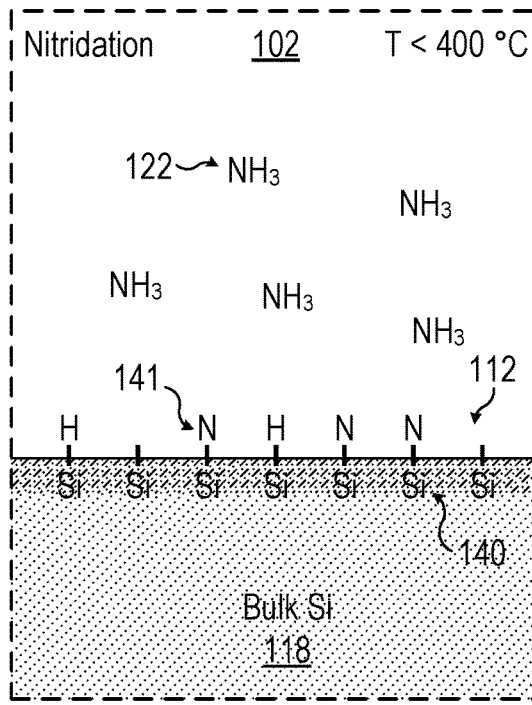
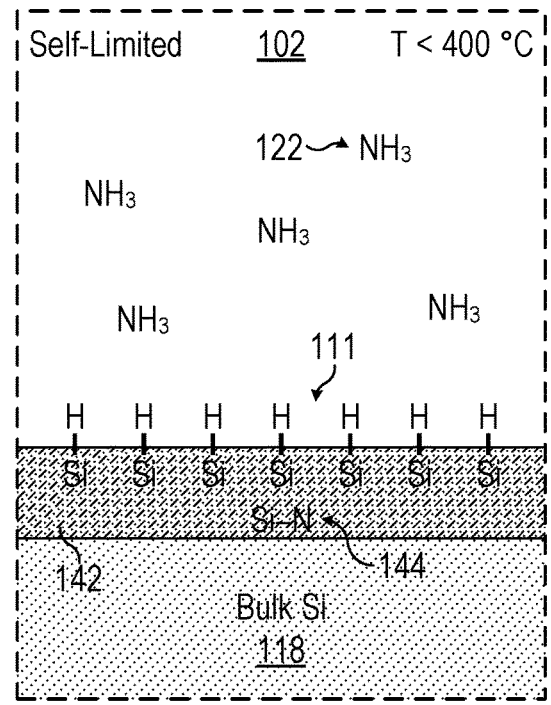
FIG. 1C
FIG. 1D

CYCLIC LOW TEMPERATURE FILM GROWTH PROCESSES

TECHNICAL FIELD

The present invention relates generally to low temperature film growth processes, and, in particular embodiments, to methods and apparatuses for film growth processes performed cyclically at low temperature.

BACKGROUND

Device formation within microelectronic workpieces may involve a series of manufacturing techniques including formation, patterning, and removal of a number of layers of material on a substrate. Film formation processes are essential during device formation and may be deposited and/or grown on a substrate surface. For example, film growth processes typically utilize a material in the substrate (e.g. an exposed surface) as a component of the film and/or as a seed region for crystal growth.

Nitride materials may be used in the manufacture of microelectronic devices as barrier layers, passivation layers, dielectric layers, mask layers, and as substrates. Some examples of useful nitrides for microelectronic devices are silicon nitride, silicon oxynitride, aluminum nitride, and gallium nitride. Nitridation processes such as thermal nitridation and plasma nitridation are typically used to form nitride films that include material from the substrate as a component.

Thermal and plasma assisted film growth processes such as nitridation may have several drawbacks. For example, thermal nitridation processes may exceed the thermal budget of many microelectronic workpieces (e.g. when devices have already been formed). Additionally, plasma assisted processes such as plasma nitridation may undesirably damage surfaces of the substrate. Therefore, film growth processes performed at low temperature that minimize substrate damage may be desirable.

SUMMARY

In accordance with an embodiment of the invention, a method of nitridation includes cyclically performing the following steps in situ within a processing chamber at a temperature less than about 400° C.: treating an unreactive surface of a substrate in the processing chamber to convert the unreactive surface to a reactive surface by exposing the unreactive surface to an energy flux, and nitridating the reactive surface using a nitrogen-based gas to convert the reactive surface to a nitride layer including a subsequent unreactive surface.

In accordance with another embodiment of the invention, a method of nitridation including cyclically performing the following steps in situ within a plasma processing chamber at a temperature less than about 400° C.: removing hydrogen from an unreactive region of a silicon substrate to convert the unreactive region to a reactive region by bombarding the silicon substrate with ions and photons from a plasma generated in the plasma processing chamber; and nitridating the reactive region using a hydronitrogen gas to convert the reactive region to a nitride region including a subsequent unreactive region.

In accordance with still another embodiment of the invention, a method of film growth including cyclically performing the following steps in situ within a processing chamber at a temperature less than about 400° C.: treating a hydrogenated surface of a substrate in the processing chamber to convert the hydrogenated surface to a reactive surface by removing hydrogen from the hydrogenated surface using an energy flux incident on the hydrogenated surface, the substrate including a first material, and exposing the reactive surface to a hydrogen-based gas including a second material to convert the reactive surface into a film including a subsequent hydrogenated surface and a compound including the first material and the second material.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A, 1B, 1C, 1D, 1E, 1F, 1G, and 1H illustrate an example nitridation process performed cyclically in situ in a processing chamber at a temperature less than about 400° C. in accordance with an embodiment of the invention, where FIG. 1A shows an initial state of a substrate including an unreactive surface, FIG. 1B shows a first treatment step, FIG. 1C shows a first nitridation step to form a nitride film, FIG. 1D shows a subsequent unreactive surface formed on the nitride film, FIG. 1E shows a second treatment step, FIG. 1F shows a second nitridation step, FIG. 1G shows another subsequent unreactive surface formed on the nitride film, and FIG. 1H shows a third treatment step;

Figure 1E:
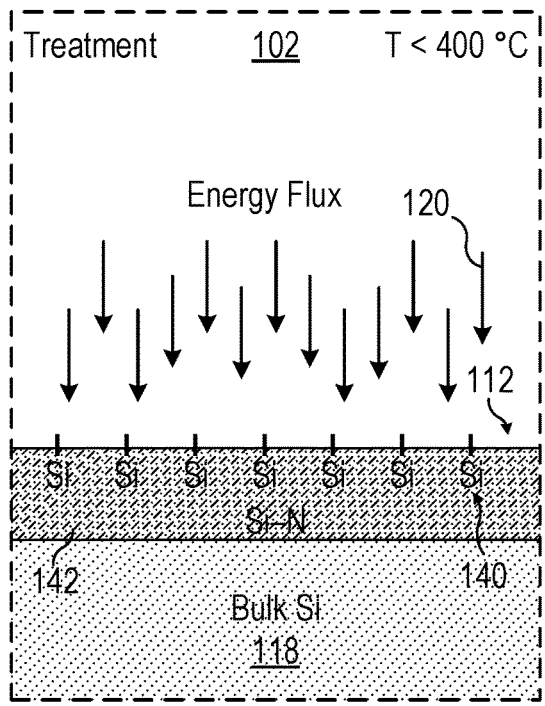

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Nitridation (also called "nitriding") is a method of forming nitride at exposed surfaces of a substrate. The nitride is formed by reacting nitrogen with the material of the substrate. Thermal nitridation (also referred to as "gas nitriding") is usually conducted at high temperature (e.g. at least 600° C. and typically >900° C.). Nitridation efficiency of thermal nitridation processes decreases the lower the temperature and ceases altogether below 400° C. in many cases. The nitrogen source is usually ammonia ($NH_3$) and is provided to the substrate by placing the substrate in an $NH_3$ ambient.

There are various drawbacks to thermal nitridation processes. The high required temperatures are typically very high relative to the thermal budget of microelectronic substrates resulting in unacceptably high substrate temperatures. For example, the elevated substrate temperatures may cause uncontrolled re-diffusion of dopants resulting in undesirable dopant redistribution. Other side effects to substrate materials are also possible such as device degradation and material modification. Consequently, thermal nitridation processes are frequently not compatible with device fabrication processes (e.g. for advanced nodes).

Plasma nitridation is also used as a method of forming nitride at exposed surfaces of a substrate. Although considered an alternative to thermal nitridation because of potentially lower temperatures, plasma nitridation is still typically carried out at around 400° C. Despite being lower than 600° C., plasma nitridation temperatures of 400° C. may be more accurately thought of as a moderate temperature relative to the thermal budgets of microelectronic substrates (e.g. not low temperature from a device perspective). Further, plasma nitridation has additional potential drawbacks of inducing damage to the substrate and non-conformal nitridation.

Other techniques may be used in addition to or in lieu of thermal nitridation and plasma nitridation. For example, sophisticated reactive chemicals may be used. However, this may raise cost and complexity. Techniques such as atomic layer deposition (ALD) may also be used. Yet, ALD is slow (e.g. 1-2 nm/min.), expensive, and sensitive requiring extremely pure materials, precise operating conditions, and involved pretreatment surface preparation. Further, ALD may also require high substrate temperature, such as in thermal ALD and in plasma enhanced ALD.

Conventional nitridation processes disadvantageously require high temperatures (e.g. above the thermal budget of a substrate) and different equipment (e.g. increasing complexity, decreasing throughput, and potentially increasing exposure to contaminants). Further, conventional mechanisms to lower nitridation processing temperature are expensive, complicated, and result in other undesirable effects such as substrate damage. These drawbacks of conventional nitridation processes also apply to various other conventional film growth processes. Therefore, film growth processes that may be performed at low temperature, minimize substrate damage, and may be performed without additional specialized equipment may be desirable.

The inventors have confirmed that no silicon (Si) nitridation occurs in an ammonia ($NH_3$) ambient below 400° C. However, the reaction barrier for nitridation at lower temperature (e.g. below 400° C.) may be due to the passivation of the Si surface by hydrogen (H) atoms dissociated from $NH_3$ chemisorbed on the Si surface. The inventors discovered that dangling bonds created by removal of H facilitate nitridation at lower temperatures. As a result, a completely different regime may be explored for achieving nitride formation at room temperature or any low temperature below 400° C.

Further, the reaction barrier of other film growth processes may also be overcome or reduced by removing terminating species from the surface. For example, this concept may be extended to not only Si nitridation, but also to any semiconductor and metallic surface nitridation. Additionally, potentially useful for other film growth processes such as nitride growth, area selective deposition (ASD), carbide formation, oxide formation, and others.

In various embodiments, a film growth process includes cyclically performing a treatment step and a surface exposure step in situ within a processing chamber at a temperature less than about 400° C. The treatment step includes generating an energy flux incident on an unreactive surface to convert the unreactive surface of a substrate in the processing chamber to a reactive surface. For example, the unreactive surface may be a hydrogenated (i.e. hydrogen terminated) surface and the energy flux may remove some or all of the hydrogen resulting in a reactive surface (e.g. with dangling bonds).

The surface exposure step includes exposing the reactive surface to a precursor gas (e.g. a hydrogen-based gas) that includes a reactive material. The reactive material of the precursor gas reacts with the surface and subsurfaces of the substrate that include a bulk material to form a film that includes a compound formed from the reactive material and the bulk material. The film formed from the reaction also includes a subsequent unreactive surface. That is, a surface of the film exposed to the precursor gas becomes less reactive over time resulting in another unreactive surface available for treatment in a subsequent treatment step of the next cycle (e.g., the process is self-limiting).

In various embodiments, the film growth process is a nitridation process. The temperature may be significantly lower than 400° C. (e.g. <about 250° C. or room temperature). The energy flux may be provided using energetic particles, thermal flashing, or other suitable means. In some embodiments, the processing chamber is a plasma processing chamber and the energy flux is provided using a plasma generated in the plasma processing chamber. The substrate may be any suitable substrate, and includes Si in some embodiments. In one embodiment, the precursor gas is $NH_3$ gas.

The film growth processes described herein may advantageously enable film growth (e.g. thermal nitridation of Si or other surfaces) at low temperatures below about 400° C. such as less than about 250° C. or at about room temperature. Nitridation or nitride growth at room temperature/low temperature may be significantly beneficial for process integration and novel capital equipment development. For example, the film growth processes may add value to current equipment with expanded process window.

The embodiment film growth processes may be beneficial to both logic and memory devices and processes. The film growth processes (e.g. nitridation and/or nitride growth processes) may advantageously avoid the need of high temperature (e.g. in thermal processes) moderate temperature (e.g. in plasma processes), which may be beneficial to device properties and process integration.

Additionally, layer-by-layer self-limiting film growth processes may be advantageously achievable at room temperature/low temperature below about 400° C. A further advantage may be to enable area selected film growth (e.g. ASD) on different regions of Si surfaces. The mechanisms may be advantageously extended from Si surfaces to other suitable surfaces such as other semiconductor surfaces, metallic surfaces, and dielectric surfaces.

Embodiments provided below describe various methods and apparatuses for film growth processes, and in particular, film growth processes performed cyclically at low temperature. The following description describes the embodiments.

Figure 3:
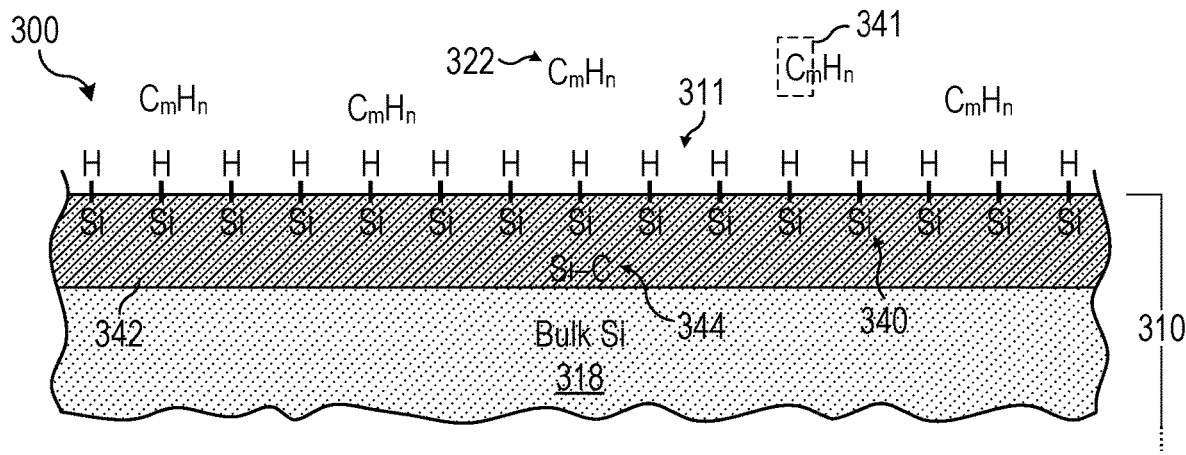
FIG. 3 illustrates an example carbonization process used to form silicon carbide at a temperature less than about 400° C. in accordance with an embodiment of the invention.
Figure 4:
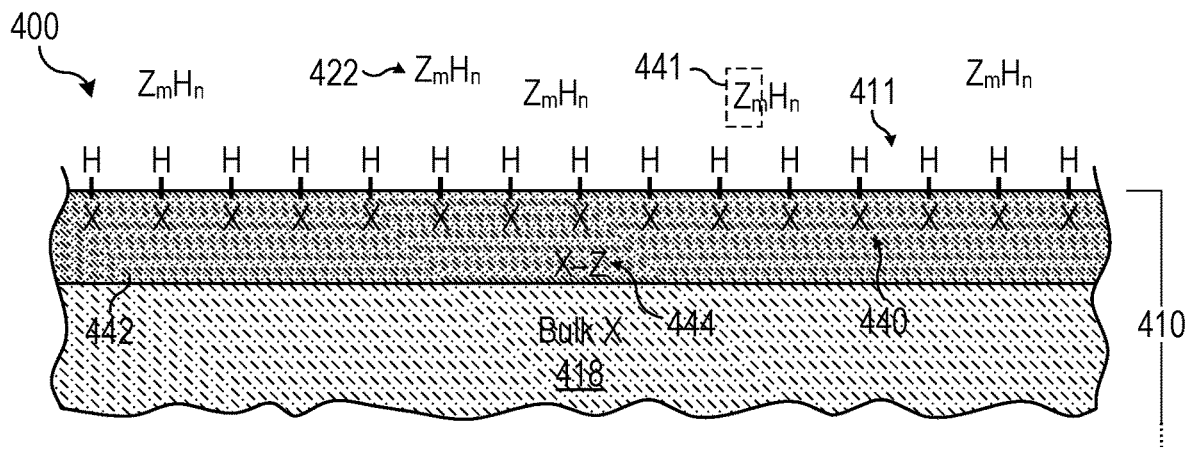
FIG. 4 illustrates an example film growth process performed at a temperature less than about 400° C. in accordance with an embodiment of the invention.

FIGS. 1A-1H are used to describe an example nitridation process. Another example nitridation process is described using FIG. 2. FIGS. 3 and 4 are used to describe an example carbonization process and an example film growth process, respectively. Two example apparatuses are described using FIGS. 5 and 6 while an example method of nitridation is described using FIG. 7 and an example method of film growth is described using FIG. 8.

Figure 1F:
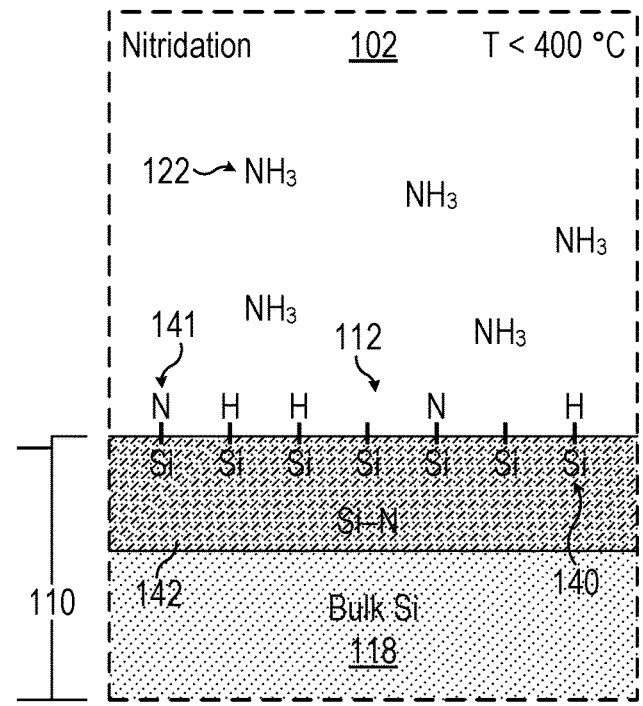
Figure 1G:
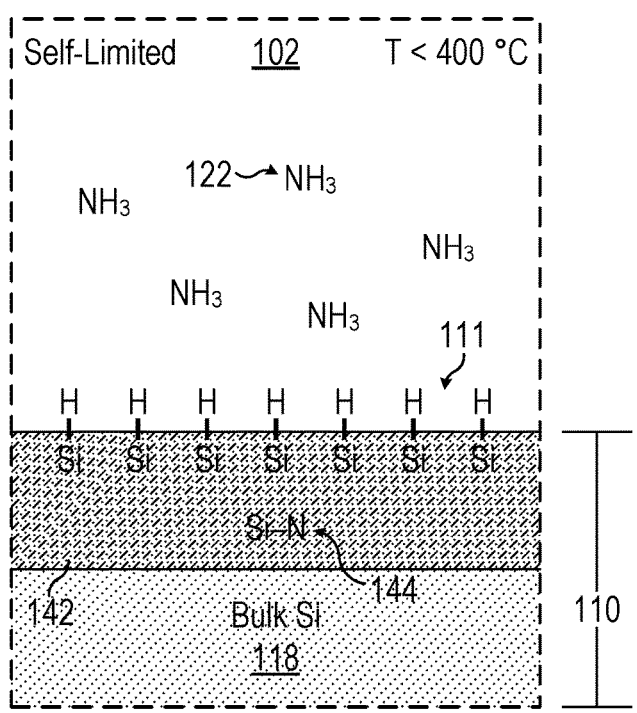
Figure 1H:
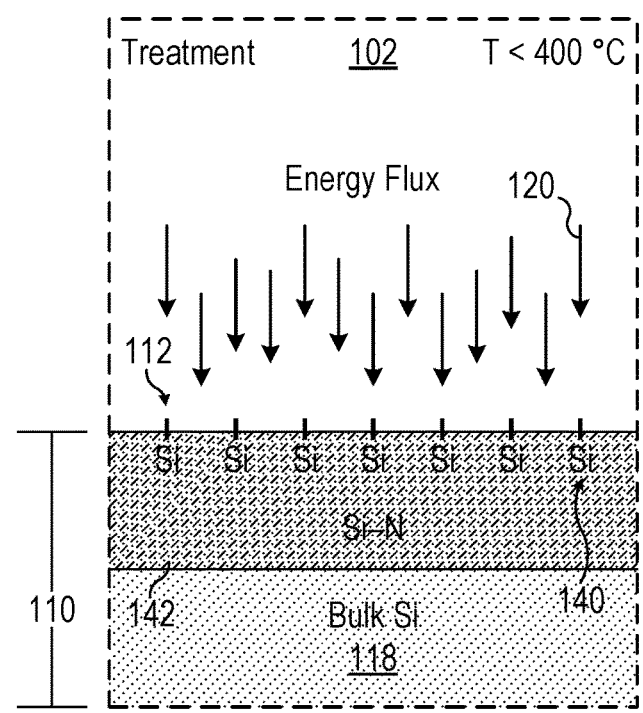

FIGS. 1A, 1B, 1C, 1D, 1E, 1F, 1G, and 1H illustrate an example nitridation process performed cyclically in situ in a processing chamber at a temperature less than about 400° C. in accordance with an embodiment of the invention. FIG. 1A shows an initial state of a substrate including an unreactive surface, FIG. 1B shows a first treatment step, FIG. 1C shows a first nitridation step to form a nitride film, FIG. 1D shows a subsequent unreactive surface formed on the nitride film, FIG. 1E shows a second treatment step, FIG. 1F shows a second nitridation step, FIG. 1G shows another subsequent unreactive surface formed on the nitride film, and FIG. 1H shows a third treatment step.

Referring to FIG. 1A, a nitridation process 100 includes an initial state of a substrate 110 that includes a bulk region 118 and an unreactive surface 111. The unreactive surface 111 may be a passivated surface that is passivated by terminated bonds. For example, the unreactive surface 111 may be a hydrogenated surface as shown. Alternatively, the unreactive surface 111 may be terminated with another species (i.e. a species different from the material of the substrate 110 that reacts with nitrogen to form a nitride).

In various embodiments the substrate 110 is a semiconductor substrate and is a silicon substrate in one embodiment. In other embodiments, the semiconductor substrate may be germanium (Ge) or be a compound semiconductor including, gallium (Ga), arsenic (As), nitrogen (N), etc. Alternatively, the substrate 110 may be a metallic substrate or a dielectric substrate. For instance, the substrate 110 may be aluminum, carbon (e.g. graphene), or silicon oxide ($SiO_2$). Additionally, the substrate 110 may include many different material layers and may be the top layer of a multilayer substrate. For example, the substrate 110 may be $SiO_2$ that is formed on top of another material.

The substrate 110 is disposed within a processing chamber 102. The processing chamber 102 may be any suitable processing chamber 102. However, the processing chamber 102 need only be a low temperature processing chamber (e.g. need not be capable of heating the substrate to greater than about 400° C.). In various embodiments, the processing chamber 102 is a multipurpose processing chamber and is a plasma processing chamber in one embodiment.

Referring now to FIG. 1B, the nitridation process 100 further includes a first treatment step performed in situ in the processing chamber 102 in which an energy flux 120 is provided to the unreactive surface 111 of the substrate 110. The energy flux 120 converts the unreactive surface 111 to a reactive surface 112. For example, in the case where the unreactive surface 111 is a hydrogenated surface (as shown) the energy flux 120 provides sufficient energy to the unreactive surface 111 to remove hydrogen leaving the reactive surface 112. As shown, the reactive surface 112 may be reactive as a result of dangling bonds created at the surface (e.g. reactions with the reactive surface 112 may be energetically favorable).

In some cases, the energy flux 120 or the duration of the treatment may be such that only regions of the unreactive surface are made reactive. For example, unreactive regions (e.g. as qualitatively indicated by unreactive region 131) may be converted to reactive regions (e.g. reactive region 132) while other portions of the unreactive surface 11 remain unreactive (e.g. hydrogen terminated). That is, the treatment may not remove all of the hydrogen during each cycle.

The energy flux 120 may expose bulk material 140 of the substrate 110 at the reactive surface 112. For example, the bulk region 118 of the substrate 110 may include the bulk material 140. In this specific example, the bulk material 140 is Si, but other bulk materials are possible. For the purposes of this disclosure, the term bulk refers to a material that comprises a majority of the substrate 110 (which may be the top layer of a multilayer substrate).

The energy flux 120 may be provided to the substrate using any suitable method that does not raise the substrate temperature above 400° C. or damage the underlying structure of the substrate 110. For example, the energy flux 120 may be provided to the substrate 110 using energetic particles (e.g. ions, electrons, radicals, photons). In various embodiments, the energy flux 120 is a beam of energetic particles and is a mixture of energetic particles generated by plasma in some embodiments. For example, the energy flux 120 may include electron beam irradiation, ion beam irradiation (e.g. inert ions such as $Ar^+$, $He^+$, and others), ultraviolet (UV) light irradiation (i.e. <400 nm in wavelength), inert radical beam irradiation, inert gas plasma (e.g. He plasma, Ar plasma, etc.), or thermal flashing of the unreactive surface above 400° C. and quickly back to low temperature.

In one embodiment, the energy flux 120 is generated by helium (He) plasma. Inert gas plasmas such as He plasma may function as an energy flux source that is a combination of energetic particle beams: ions, electrons, radicals, and photons. The He plasma may generate ions ($He^+$) and photons with sufficient energy to break bonds of a terminating species without otherwise damaging surfaces of the substrate 110. For example, in the specific example of Si—H bonds (as shown), the energy flux 120 may provide at least about 4.06 eV to Si—H bonds at the unreactive surface 111. That is, the average energy of the ions and photons may be at least about 4.06 eV. However, in some cases lower energy may also be sufficient to remove H from surfaces (e.g. providing necessary energy in the aggregate). For example, the average energy of the ions and photons may be lower than 4.06 eV (e.g. as low as 1.114 eV or lower).

The energetic particles generated by the He plasma may include, for example, energetic ions, radicals, electrons, and photons. For the specific example of He plasma, the emitted photons (e.g. UV photons) may have favorable energy (e.g. ~24 eV). In particular, He may provide the dual advantage of being lightweight so that bombardment does minimal or no damage to the substrate surface (e.g. Si/SiN surfaces) and also high energy photons (~24 eV), ions, and radicals which may advantageously efficiently remove terminating species (e.g. H) from the surface.

It should be noted that energy required to efficiently break surface bonds may vary depending on how the energy is absorbed by the unreactive surface 111. For example, energy from incident particles may be spread out among several localized surface atoms which may increase the required particle energy. Additionally, the desorption cross section of terminating species may be energy dependent and maximizing the cross section may advantageously improve efficiency. Although not critical in most cases due to the self-limiting nature of the process, uniformity of the energy flux 120 to the substrate may be desirable.

In other embodiments the energy flux 120 may be partially or entirely generated using techniques such as thermal flashing (e.g. millisecond flashing) or focused particle beams (e.g. an ion beam source, electron beam source such as an e-gun, a photon source such as a UV lamp, a radical source such as a radical generator, etc.). For instance, thermal flashing and/or focused particle beams may advantageously direct energy to localized regions (e.g. unreactive regions 131) of the unreactive surface 111 allowing area selective film growth (e.g. ASD). The specific choice of energy source(s) may depend on a variety of factors including ease of implementation, energy budget, uniformity, efficiency, and device process compatibility.

Referring to FIG. 1C, the nitridation process 100 further includes a nitridation step which includes providing a precursor gas 122 in the processing chamber 102. The precursor gas 122 includes a reactive material 141 (e.g. N) that reacts with the bulk material 140 (e.g. Si) from the substrate 110. For example, the precursor gas 122 may be introduced into the processing chamber 102 after the treatment step or may be present throughout the nitridation process 100. The precursor gas 122 is a hydrogen-based gas in various embodiments and is a hydronitrogen gas ($N_mH_n$, also referred to as a nitrogen hydride) in some embodiments.

For example, the precursor gas 122 may be an azane ($N_mH_{m+2}$) such as hydrazine ($N_2H_4$) or a cycloazane ($N_mH_m$) and may include nitrogen-based ions such as ammonium ($NH_4+$). In one embodiment, the precursor gas 122 is ammonia ($NH_3$) as shown. The precursor gas 122 may be provided with other gases such as an inert gas (e.g. carrier gas). In one embodiment, the precursor gas 122 is $NH_3$ and provided with argon (Ar) in a 1:4 ratio ($NH_3$:Ar).

However, other functional groups and elements other than N and H may also be included. Further, the precursor gas 122 may not include nitrogen. In some embodiments, the precursor gas 122 is a hydrocarbon gas, and in other embodiments, the precursor gas 122 is another hydrogen-based gas. The inclusion of hydrogen in the precursor gas may be influenced by the type of substrate. For example, hydrogen may be included in the precursor gas when the unreactive surface in is terminated with hydrogen each cycle, but may be another element or functional group in other cases.

$NH_3$ (as well as other hydronitrogen precursors, for example) may have an advantage during nitridation of being easily dissociated into $NH_x$ (x=1, 2) and H (+H) without any substrate heating. Further, in the presence of a reactive surface 112 (e.g. with dangling bonds from surface Si atoms, for example) nitridation may advantageously be thermodynamically favorable at any substrate temperature (i.e. almost no reaction barrier to nitridation when dangling bonds are available). It should be noted that in FIG. 1C and other similar figures, nitridated surface sites are illustrated as a N for clarity, but may also be other nitrogen-containing species such as $NH_x$ (x=1, 2), for example. Analogous concepts also apply reactive species other than N.

The treatment step may be carried out in a vacuum (e.g. medium vacuum or high vacuum). Additionally, the treatment step may be performed in a non-hydrogen environment (e.g. without the presence of an ambient hydrogen-based gas such as $NH_3$) and then followed by the introduction of the precursor gas 122 simultaneously (or delayed after) turning off the treatment process (e.g. H removal process). For example, the source power for an energy source providing the energy flux 120 may be removed (i.e. turned off) and the precursor gas 122 may be introduced into the processing chamber 102 to begin the nitridation step.

Alternatively, the treatment step and the nitridation step may be performed concurrently. That is, the energy flux 120 (e.g. an inert plasma such as an He plasma) may be provided in the processing chamber 102 simultaneously with the precursor gas 122 (e.g. $NH_3$). In this scenario, H atoms may be continuously accumulated and removed at exposed surfaces of the substrate 110 allowing thermodynamically (i.e. energetically) favorable sites to be constantly generated even as H passivates regions of the surface. Such a scenario may be an example of a situation resulting in the formation of unreactive regions 131 and reactive regions 132 rather than entire surfaces or substantial portions of surfaces being unreactive or reactive at any given time.

Referring now to FIG. 1D, the nitridation step of the nitridation process 100 continues with the reactive material 141 of the precursor gas 122 continuing to form bonds with the bulk material 140 of the substrate 110 to form a nitride layer 142 comprising a nitride compound 144. As shown the nitride compound 144 includes bonds (Si—N) between the reactive material 141 and the bulk material 140. In one embodiment, the nitride compound 144 is $Si_3N_4$.

However, the precursor gas 122 also converts the reactive surface 112 into a subsequent unreactive surface 11 causing the nitridation step to be self-limited. That is, the nitridation reactions at the surface of the substrate 110 may slow down or stop as reaction sites (e.g. dangling bonds) are occupied by terminating species (e.g. H). For example, Si dangling bonds may facilitate nitridation, but the nitridation may not proceed if no dangling bonds are available, such as being passivated by H atoms as shown.

Consequently, the treatment and nitridation steps may be cyclically repeated to advantageously form a nitride layer in a layer-by-layer (or substantially layer-by-layer) process. Such layer-by-layer control may enable high uniformity and/or precise thickness control.

The in situ cyclic process may be advantageously performed at much higher rate compared to conventional layer-by-layer processes (such as ALD, with steps on the order of minutes). For example, both the treatment step and the nitridation step may take place on the order of seconds. In one embodiment, the treatment step is performed in less than about 5 s. In one embodiment, the nitridation step is performed in less than about 5 s. The timescale of the treatment and nitridation steps may depend on the energy flux, cycle efficiency, gas flowrate, pumping speed, and/or temperature (e.g. faster at higher temperature). The respective durations of the treatment step and the nitridation step may be similar or different depending on the specific details of a given implementation of the nitridation process.

Further, the in situ performance of the nitridation process may also beneficially enable nitride formation after other fabrication processes without removing the substrate from the processing chamber. For example, the processing chamber may be a multipurpose processing chamber used as a plasma processing chamber before and/or after being used as a nitridation processing chamber for the nitridation process.

Referring now to FIGS. 1E, 1F, 1G, and 1H, the treatment step and the nitridation step is iterated in a cyclical manner to illustrate the continued formation of a nitride layer 142 of increased thickness at the substrate 110. A second treatment step is performed (FIG. 1E) to convert the subsequent unreactive surface 111 formed as a result of the self-limiting nature of the previous nitridation step into a reactive surface 112 which in turn is again converted during a second nitridation step (FIG. 1F) into an unreactive surface 111 (FIG. 1G) after the nitride layer 142 increases in thickness. The energy flux 120 is again applied in a third treatment step (FIG. 1H) and so on.

Each of the above steps is performed at a temperature less than about 400° C. For example, the temperature may be less than about 250° C. and may be room temperature. Room temperature may defined as being generally low temperature (e.g. between about 20° C. and about 40° C. such as 25° C., 22° C., etc.) and may refer to the ambient temperature within the processing chamber. However, "room temperature" may also refer to situations in which no additional chamber or substrate heating is provided during the process (e.g. the energy flux may result in localized surface heating). Additionally, the above steps may also be performed at temperatures below room temperature (e.g. 0° C. and lower).

Importantly, the whole of the substrate does not rise above about 400° C. and is much lower in many cases. For example, additional chamber or substrate heating may be avoided unless desired for specific purposes (e.g. Si—$NH_x$ bonded films which may be useful in certain circumstances). For example, the chamber temperature may be maintained at about 250° C. to form ternary compounds including Si, N, and H (silicon nitrohydrides) in some embodiments. That is, temperature (below about 400° C. and may be below about 250° C.) may be useful to control hydrogen content of the nitride layer.

In the case of thermal flashing, the temperature of the substrate surface may be locally increased on the order of milliseconds to provide the requisite energy to the unreactive surface, but avoid damaging other regions of the substrate.

Figure 2:
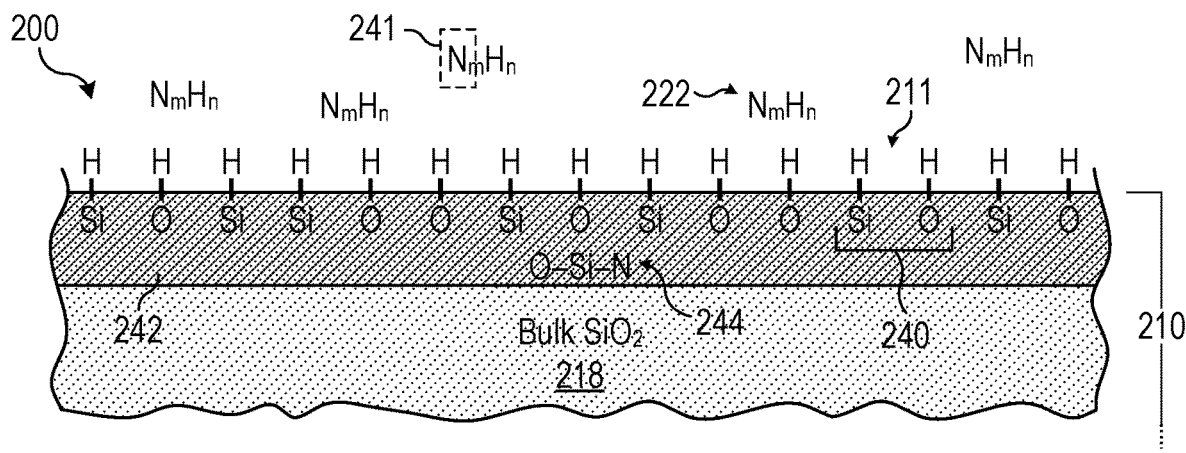
FIG. 2 illustrates another example nitridation process used to form silicon oxynitride at a temperature less than about 400° C. in accordance with an embodiment of the invention.

FIG. 2 illustrates another example nitridation process used to form silicon oxynitride at a temperature less than about 400° C. in accordance with an embodiment of the invention. The nitridation process of FIG. 2 may be a specific implementation of other film growth processes (e.g. nitridation processes) described herein such as the nitridation process of FIGS. 1A-1H, or the film growth process of FIG. 4, as examples. Similarly labeled elements may be as previously described.

Referring to FIG. 2, a nitridation process 200 includes a substrate 210 that includes a bulk region 218 and a nitride layer 242. It should be noted that here and in the following a convention has been adopted for brevity and clarity wherein elements adhering to the pattern [x10] may be related implementations of a plasma processing chamber in various embodiments. For example, the substrate 210 may be similar to the substrate 110 except as otherwise stated. An analogous convention has also been adopted for other elements as made clear by the use of similar terms in conjunction with the aforementioned three-digit numbering system.

The nitridation process 200 is illustrated only by the representative self-limited stage of the nitridation step, also for brevity and clarity, the remaining steps being analogous to those of FIGS. 1A-1H, but with differences, some of which are described in the following. In the nitridation process 200 the substrate 210 is an oxide (e.g. entirely or an oxide layer on a multilayer substrate). The bulk region 218 of the substrate 210 includes $SiO_2$ as shown resulting in a bulk material 240 that includes both Si and O.

A precursor gas 222 is provided during the nitridation step following or during a treatment step of delivering an energy flux to an unreactive surface 211 of the substrate 210. The precursor gas 222 is a hydronitrogen gas including a reactive material 241 (N, as shown), but may also be other gases as previously described. In one embodiment, the precursor gas 222 is $NH_3$.

The resulting nitride layer 242 includes an oxynitride compound 244 formed from the reaction of the reactive material 241 (N) with the bulk material 240 (Si and oxygen, O). In one specific example, the oxynitride compound 244 is silicon oxynitride (e.g. $Si_2N_2O$ or with some degree of amorphousness with local variations between $SiO_2$ and $Si_3N_4$), but the nitridation process 200 may be generalized to the formation of other oxynitrides.

FIG. 3 illustrates an example carbonization process used to form silicon carbide at a temperature less than about 400° C. in accordance with an embodiment of the invention. The carbonization process of FIG. 3 may be a specific implementation of other film growth processes described herein such as the film growth process of FIG. 4, for example. Similarly labeled elements may be as previously described.

Referring to FIG. 3, a carbonization process 300 includes a substrate 310 that includes a bulk region 318 and a carbide layer 342. As in FIG. 2, the carbonization process 300 is illustrated only by the representative self-limited stage of a carbonization step (which is analogous to a nitridation step), for brevity and clarity. The remaining steps are analogous to those of FIGS. 1A-1H, but with differences, some of which are described in the following.

In the carbonization process 300 the substrate 310 is a semiconductor and is Si in some embodiments (e.g. entirely or a Si layer on a multilayer substrate). The bulk region 318 of the substrate 310 includes a bulk material 340 of Si as shown. A precursor gas 322 is provided during a carbonization step following or during a treatment step of delivering an energy flux to an unreactive surface 311 of the substrate 310.

In contrast to previously described precursors, the precursor gas 322 is a hydrocarbon gas including a reactive material 341 (carbon, C, as shown), but may also be other gases that include C. In various embodiments, the precursor gas 322 is an alkane. Alternatively or additionally, the precursor gas 322 includes other hydrocarbon gases such as alkenes, alkynes, and/or cyclic and substituted variations. In one embodiment, the precursor gas 322 includes methane ($CH_4$). In one embodiment, the precursor gas 322 includes ethylene ($C_2H_4$).

The resulting carbide layer 342 includes a carbide compound 344 formed from the reaction of the reactive material 341 (C) with the bulk material 340 (Si). In one specific example, the carbide compound 344 is silicon carbide (SiC), but the carbonization process 300 may be generalized to the formation of other carbides.

FIG. 4 illustrates an example film growth process performed at a temperature less than about 400° C. in accordance with an embodiment of the invention. The film growth process of FIG. 4 may be a general implementation of other film growth processes (e.g. nitridation processes, carbonization processes, etc.) described herein such as the nitridation process of FIGS. 1A-1H and 2 or the carbonization process of FIG. 3, as examples. Similarly labeled elements may be as previously described.

Referring to FIG. 4, a film growth process 400 includes a substrate 410 that includes a bulk region 418 and a film 442. As in FIG. 2, the film growth process 400 is illustrated only by the representative self-limited stage of a film growth step (which is a generalization of a nitridation step), for brevity and clarity. The remaining steps are analogous to those of FIGS. 1A-1H, but with differences, some of which are described in the following.

The film 442 is formed during a film growth step where a precursor gas 422 is provided following or during a treatment step of delivering an energy flux to an unreactive surface 411 of the substrate 410. The film 442 is the result of a reaction between a reactive material 441 of the precursor gas 422 and a bulk material 440 of the substrate 410.

In this generalized scenario, the reactive material 441 is illustrated as some species Z (specific examples of which have been N and C) while the bulk material 440 is illustrated as some species X (specific provided examples including Si and Si, O). The film 442 then includes a compound 444 including X and Z (e.g. X—Z bonds). For example, X may be C (e.g. when the substrate 410 is graphene), aluminum (Al), and others that have not been specifically described. Similarly, Z may be O, a reactive functional group, and others.

Figure 5:
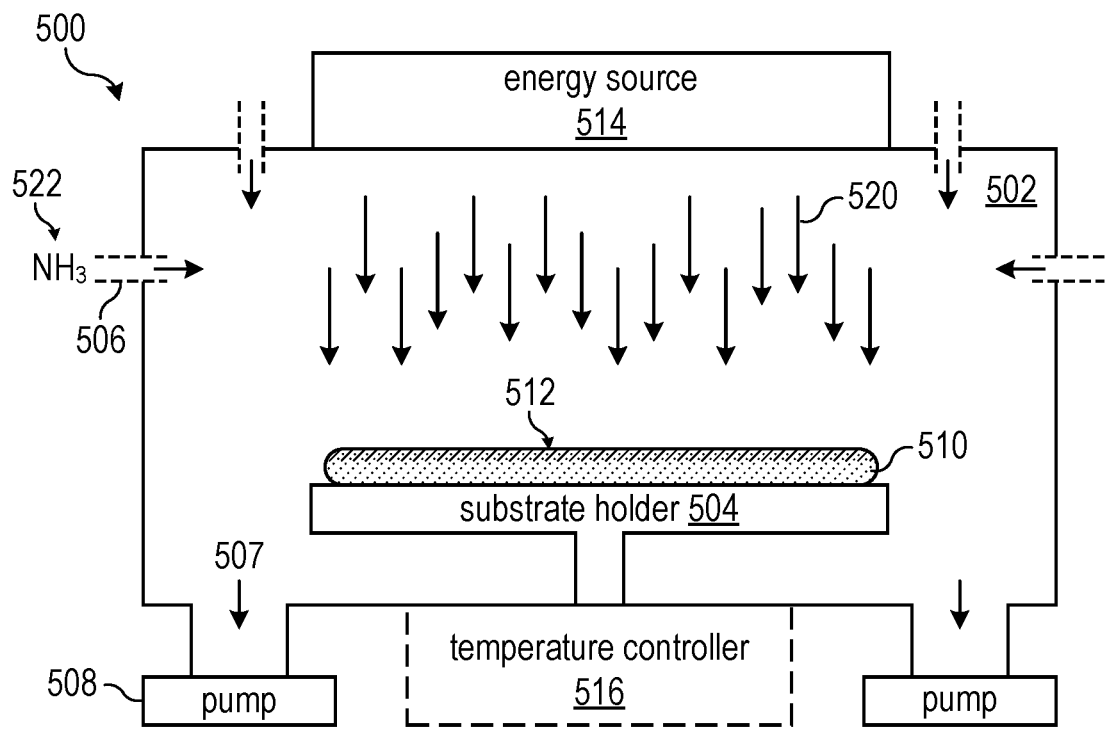
FIG. 5 illustrates an example film growth apparatus in accordance with an embodiment of the invention.

FIG. 5 illustrates an example film growth apparatus in accordance with an embodiment of the invention. The film growth apparatus of FIG. 5 may be a used to perform any of the film growth processes as described herein, such as the film growth processes of FIGS. 1A-1H and 2-4. The film growth apparatus of FIG. 5 may also be used to perform the film growth methods as subsequently described in FIGS. 7 and 8. Similarly labeled elements may be as previously described.

Referring to FIG. 5, a film growth apparatus 500 includes a substrate holder 504 supporting a substrate 510 within a processing chamber 502. For example, the processing chamber 502 may be a multipurpose processing chamber. Various gases such as a precursor gas 522 (shown here as $NH_3$) may be provided into the processing chamber 502 through one or more gas inlets 506. Pressure (e.g. medium vacuum, high vacuum, etc.) may be controlled in the processing chamber 502 using pumps 508 which evacuate the precursor gas 522 as well as other gases out of the processing chamber 502 through one or more gas outlets 507.

An energy source 514 provides an energy flux 520 a surface 512 of the substrate 510. As previously described, the energy flux 520 may be provided after or during the precursor gas 522. The energy source 514 may be any suitable energy source or combination of energy sources such as a plasma source, ion beam source, electron beam source, photon source (e.g. UV light source), radical beam source, thermal flashing source, and others.

When temperature control (i.e. less than about 400° C.) is desired, an optional temperature controller 516 may be included to control the temperature of the substrate holder 504 and/or the substrate 510. The optional temperature controller 516 may also include an energy source such as a thermal flashing source in some implementations.

Figure 6:
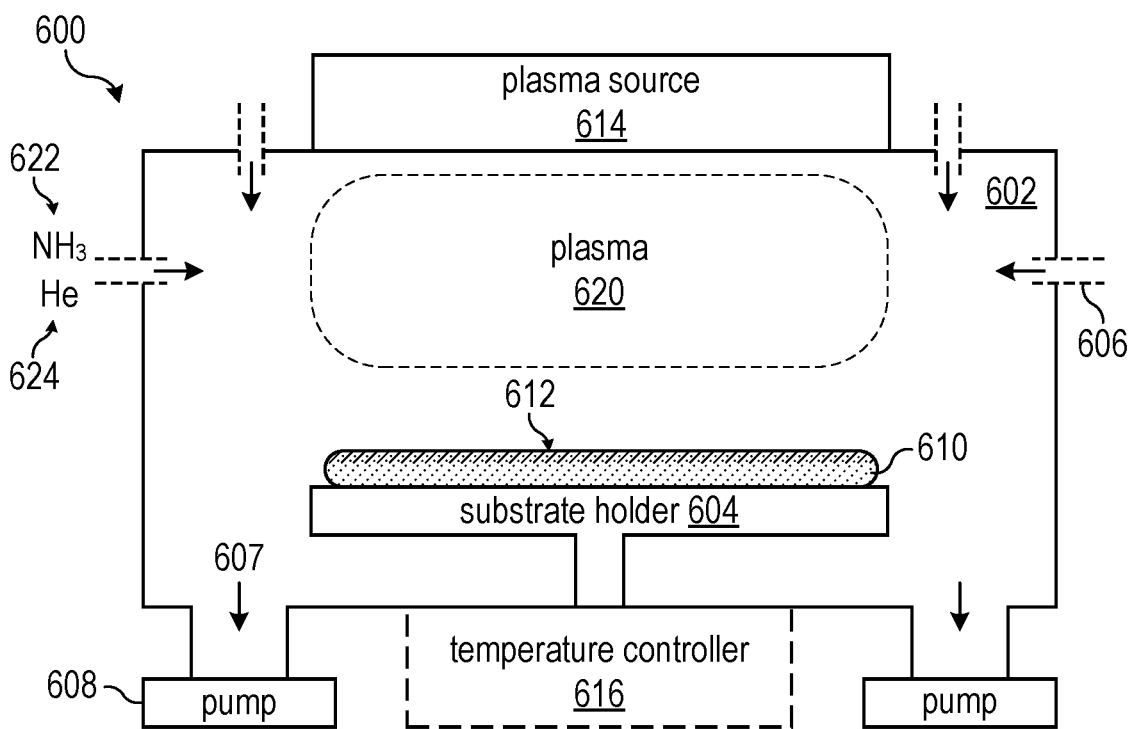
FIG. 6 illustrates an example plasma processing apparatus in accordance with an embodiment of the invention.

FIG. 6 illustrates an example plasma processing apparatus in accordance with an embodiment of the invention. The plasma processing apparatus of FIG. 6 may be a used to perform any of the film growth processes as described herein, such as the film growth processes of FIGS. 1A-1H and 2-4. Additionally, the plasma processing apparatus of FIG. 6 may be used to perform the film growth methods as subsequently described in FIGS. 7 and 8. Similarly labeled elements may be as previously described.

Referring to FIG. 6, a plasma processing apparatus 600 includes a substrate holder 604 supporting a substrate 610 within a plasma processing chamber 602. The plasma processing apparatus of FIG. 6 may be a specific implementation of the film growth apparatus of FIG. 5 where the energy source is a plasma source 614 and the energy flux to a surface 612 of the substrate 610 is provided by plasma 620 generated in the plasma processing chamber 602. For example, the plasma 620 may be an inert plasma (e.g. He plasma) generated using an inert gas 624 (e.g. He) supplied through one or more gas inlets 606.

A precursor gas 622 may also be provided through the gas inlets 606 (e.g. the same gas inlets as the inert gas 624 or dedicated gas inlets). A pump 608 evacuates the precursor gas 622, the inert gas 624, and any other gases from the plasma processing chamber 602 through one or more gas outlets 607. As before, an optional temperature controller 616 may be included if substrate temperature control is desired.

Figure 7:
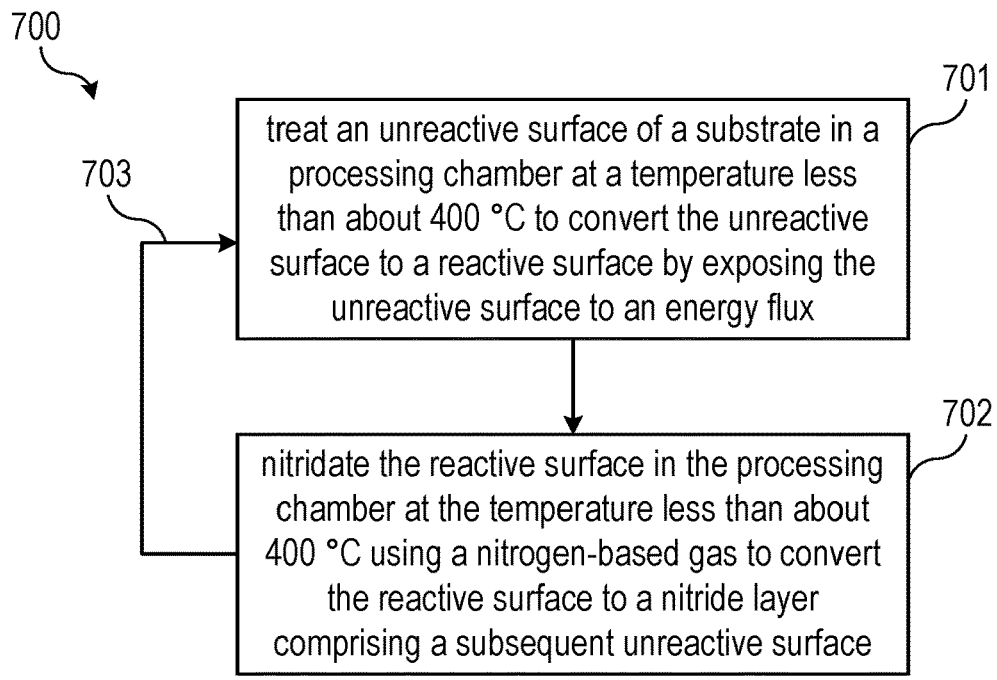
FIG. 7 illustrates an example method of nitridation in accordance with an embodiment of the invention.

FIG. 7 illustrates an example method of nitridation in accordance with an embodiment of the invention. The method of FIG. 7 may be combined with other methods and processes and may be performed using any of the film growth apparatuses described herein, such as the film growth apparatus of FIG. 5 or the plasma processing apparatus of FIG. 6, as examples. Further, the method of FIG. 7 may apply some or all of the steps of any of the embodiment processes as described herein such as the nitridation process of FIGS. 1A-1H or the film growth process of FIG. 4, as examples. Although shown in a logical order, the arrangement and numbering of the steps of FIG. 7 are not intended to be limited. The method steps of FIG. 7 may be performed in any suitable order or concurrently with one another as may be apparent to a person of skill in the art.

Referring to FIG. 7, step 701 of a method of nitridation 700 includes treating an unreactive surface of a substrate to convert the unreactive surface to a reactive surface by exposing the unreactive surface to an energy flux. Step 702 of the method of nitridation 700 includes nitridating the reactive surface using a nitrogen-based gas to convert the reactive surface to a nitride layer comprising a subsequent unreactive surface. Steps 701 and 702 are performed in a processing chamber (i.e. in situ without removing the substrate from the processing chamber) and at a temperature less than about 400° C.

Step 703 is to cyclically perform steps 701 and 702. Specifically, step 702 may be self-limited by the subsequent unreactive surface which may then be removed by a subsequently performed treatment step (step 701). The method of nitridation 700 may be continued until a desired uniformity and/or thickness of the nitride film is achieved. In some cases metrology (e.g. in situ) may be utilized to dynamically determine the state of the nitride layer so that the processing conditions may be adjusted or the cycle may be timely terminated. For example, in situ ellipsometry may be used. Additionally the ratio of species (e.g. N/H signal ratio) during the energy flux (e.g. plasma generation) may provide insight.

Figure 8:
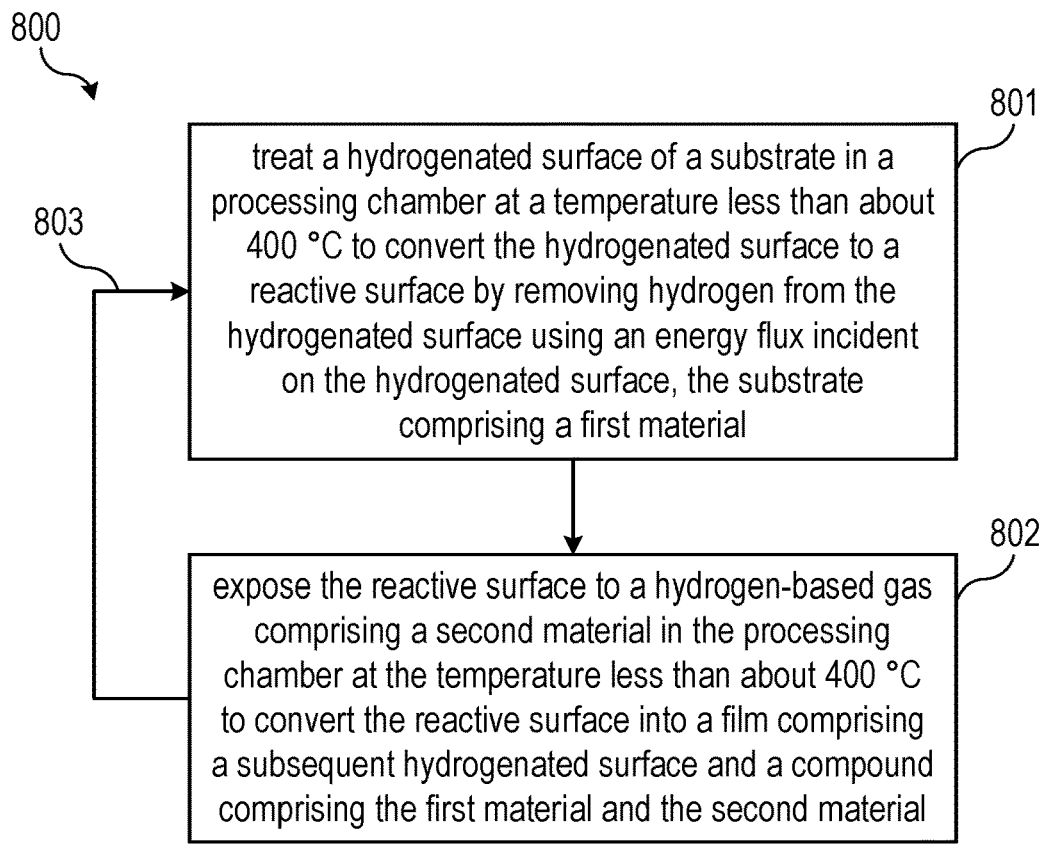
FIG. 8 illustrates an example method of film growth in accordance with an embodiment of the invention.

FIG. 8 illustrates an example method of film growth in accordance with an embodiment of the invention. The method of FIG. 8 may be combined with other methods and processes and may be performed using any of the film growth apparatuses described herein, such as the film growth apparatus of FIG. 5 or the plasma processing apparatus of FIG. 6, as examples. Additionally, the method of FIG. 8 may apply some or all of the steps of any of the embodiment processes as described herein such as the nitridation process of FIGS. 1A-1H or the film growth process of FIG. 4, as examples. Although shown in a logical order, the arrangement and numbering of the steps of FIG. 8 are not intended to be limited. The method steps of FIG. 8 may be performed in any suitable order or concurrently with one another as may be apparent to a person of skill in the art.

Referring to FIG. 8, step 801 of a method of film growth 800 includes treating a hydrogenated surface of a substrate to convert the hydrogenated surface to a reactive surface by removing hydrogen from the hydrogenated surface using an energy flux incident on the hydrogenated surface. The substrate includes a first material. The reactive surface is exposed to a hydrogen-based gas including a second material in step 802 to convert the reactive surface into a film. The film includes a subsequent hydrogenated surface and a compound comprising the first material and the second material. Steps 801 and 802 are performed in a processing chamber at a temperature less than about 400° C. Step 803 is to cyclically perform steps 801 and 802.

Example embodiments of the invention are summarized here. Other embodiments can also be understood from the entirety of the specification as well as the claims filed herein.

Example 1. A method of nitridation including cyclically performing the following steps in situ within a processing chamber at a temperature less than about 400° C.: treating an unreactive surface of a substrate in the processing chamber to convert the unreactive surface to a reactive surface by exposing the unreactive surface to an energy flux; and nitridating the reactive surface using a nitrogen-based gas to convert the reactive surface to a nitride layer including a subsequent unreactive surface.

Example 2. The method of example 1, further including: where each treatment of an unreactive surface is performed for less than about 5 seconds; and where each nitridation of a reactive surface is performed for less than about 5 seconds.

Example 3. The method of one of examples 1 and 2, where the nitrogen-based gas includes ammonia ($NH_3$).

Example 4. The method of one of examples 1 to 3, where treating the unreactive surface includes providing the energy flux using a plasma generated in the processing chamber.

Example 5. The method of one of examples 1 to 4, where treating the unreactive surface comprises providing the energy flux using an ion beam source, an electron beam source, a photon source, a radical source, or a thermal flashing source.

Example 6. The method of one of examples 1 to 5, where treating the unreactive surface includes concurrently applying source power to generate the energy flux, and preventing dissemination of the nitrogen-based gas into the processing chamber; and nitridating the reactive surface includes concurrently removing the source power, and supplying the nitrogen-based gas to the processing chamber.

Example 7. A method of nitridation including cyclically performing the following steps in situ within a plasma processing chamber at a temperature less than about 400° C.: removing hydrogen from an unreactive region of a silicon substrate to convert the unreactive region to a reactive region by bombarding the silicon substrate with ions and photons from a plasma generated in the plasma processing chamber; and nitridating the reactive region using a hydronitrogen gas to convert the reactive region to a nitride region including a subsequent unreactive region.

Example 8. The method of example 7, where the ions and photons include an average energy greater than about 4.06 eV.

Example 9. The method of one of examples 7 and 8, where removing the hydrogen from the unreactive region and nitridating the reactive region are performed concurrently.

Example 10. The method of one of examples 7 to 9, where the hydronitrogen gas includes ammonia ($NH_3$).

Example 11. The method of one of examples 7 to 10, where the plasma generated in the plasma processing chamber is a helium plasma.

Example 12. The method of one of examples 7 to 11, where the temperature is less than about 30° C.

Example 13. A method of film growth including cyclically performing the following steps in situ within a processing chamber at a temperature less than about 400° C.: treating a hydrogenated surface of a substrate in the processing chamber to convert the hydrogenated surface to a reactive surface by removing hydrogen from the hydrogenated surface using an energy flux incident on the hydrogenated surface, the substrate including a first material, and exposing the reactive surface to a hydrogen-based gas including a second material to convert the reactive surface into a film including a subsequent hydrogenated surface and a compound including the first material and the second material.

Example 14. The method of example 13, further including: before cyclically repeating the steps, heating the substrate to the temperature, where the temperature is about 250° C., and where the temperature is maintained while cyclically repeating the steps.

Example 15. The method of one of examples 13 and 14, further including: before cyclically repeating the steps, treating the substrate within the processing chamber with a plasma process, where the substrate is not removed from the processing chamber between the plasma process and cyclically performing the steps.

Example 16. The method of example 15, where treating the hydrogenated surface of the substrate includes thermally flashing the hydrogenated surface to locally increase the temperature of the hydrogenated surface.

Example 17. The method of one of examples 13 to 16, where treating the hydrogenated surface includes treating the hydrogenated surface with a plasma generated in the processing chamber.

Example 18. The method of one of examples 13 to 17, where the first material is nitrogen, the second material is silicon, and the compound is silicon nitride.

Example 19. The method of one of examples 13 to 17, where the first material is nitrogen, the second material is silicon oxide, and the compound is silicon oxynitride.

Example 20. The method of one of examples 13 to 17, where the first material is carbon, the second material is silicon, and the compound is silicon carbide.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of nitridation comprising cyclically performing the following steps in situ within a processing chamber at a temperature less than about 400° C.:
    treating an unreactive surface of a substrate in the processing chamber to convert the unreactive surface to a reactive surface by exposing the unreactive surface to an energy flux; and
    nitridating the reactive surface without generating a plasma using a nitrogen-based gas to convert the reactive surface to a nitride layer comprising a subsequent unreactive surface.

2. The method of claim 1, further comprising:
    wherein each treatment of an unreactive surface is performed for less than about 5 seconds; and
    wherein each nitridation of a reactive surface is performed for less than about 5 seconds.

3. The method of claim 1, wherein the nitrogen-based gas comprises ammonia ($NH_3$).

4. The method of claim 1, wherein treating the unreactive surface comprises providing the energy flux using a plasma generated in the processing chamber.

5. The method of claim 1, wherein treating the unreactive surface comprises providing the energy flux using an ion beam source, an electron beam source, a photon source, a radical source, or a thermal flashing source.

6. The method of claim 1, wherein:
treating the unreactive surface comprises concurrently
applying source power to generate the energy flux, and
preventing dissemination of the nitrogen-based gas into the processing chamber; and
nitridating the reactive surface comprises concurrently
removing the source power, and
supplying the nitrogen-based gas to the processing chamber.

7. A method of nitridation comprising cyclically performing the following steps in situ within a plasma processing chamber at a temperature less than about 400° C.:
removing hydrogen from an unreactive region of a silicon substrate to convert the unreactive region to a reactive region by bombarding the silicon substrate with ions and photons from a plasma generated in the plasma processing chamber; and
nitridating the reactive region without generating a plasma using a hydronitrogen gas to convert the reactive region to a nitride region comprising a subsequent unreactive region.

8. The method of claim 7, wherein the ions and photons comprise an average energy greater than about 4.06 eV.

9. The method of claim 7, wherein removing the hydrogen from the unreactive region and nitridating the reactive region are performed concurrently.

10. The method of claim 7, wherein the hydronitrogen gas comprises ammonia ($NH_3$).

11. The method of claim 7, wherein the plasma generated in the plasma processing chamber is a helium plasma.

12. The method of claim 7, wherein the temperature is less than about 30° C.

13. A method of film growth comprising cyclically performing the following steps in situ within a processing chamber at a temperature less than about 400° C.:
treating a hydrogenated surface of a substrate in the processing chamber to convert the hydrogenated surface to a reactive surface by removing hydrogen from the hydrogenated surface using an energy flux incident on the hydrogenated surface, the substrate comprising a first material, and
exposing the reactive surface to a hydrogen-based gas comprising a second material without generating a plasma to convert the reactive surface into a film comprising a subsequent hydrogenated surface and a compound comprising the first material and the second material.

14. The method of claim 13, further comprising:
before cyclically repeating the steps, heating the substrate to the temperature, wherein the temperature is about 250° C., and wherein the temperature is maintained while cyclically repeating the steps.

15. The method of claim 13, further comprising:
before cyclically repeating the steps, treating the substrate within the processing chamber with a plasma process, wherein the substrate is not removed from the processing chamber between the plasma process and cyclically performing the steps.

16. The method of claim 15, wherein treating the hydrogenated surface of the substrate comprises thermally flashing the hydrogenated surface to locally increase the temperature of the hydrogenated surface.

17. The method of claim 13, wherein treating the hydrogenated surface comprises treating the hydrogenated surface with a plasma generated in the processing chamber.

18. The method of claim 13, wherein the first material is silicon, the second material is nitrogen, and the compound is silicon nitride.

19. The method of claim 13, wherein the first material is silicon oxide, the second material is nitrogen, and the compound is silicon oxynitride.

20. The method of claim 13, wherein the first material is silicon, the second material is carbon, and the compound is silicon carbide.

* * * * *